(12) United States Patent
Dechamp et al.

(10) Patent No.: US 9,842,742 B2
(45) Date of Patent: Dec. 12, 2017

(54) METHOD FOR THINNING SAMPLES

(71) Applicant: COMMISSARIAT ÀL'ENERGIE ATOMIQUE ET AUX ENERGIES ALTERNATIVES, Paris (FR)

(72) Inventors: Jérôme Dechamp, Beaucroissant (FR); Hubert Moriceau, Saint-Egreve (FR); Marc Zussy, Saint-Egreve (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/331,490

(22) Filed: Oct. 21, 2016

(65) Prior Publication Data
US 2017/0117158 A1  Apr. 27, 2017

(30) Foreign Application Priority Data

Oct. 23, 2015 (FR) ..................... 15 60141

(51) Int. Cl.
*H01L 21/306* (2006.01)
*H01L 21/304* (2006.01)
*H01L 21/683* (2006.01)

(52) U.S. Cl.
CPC ...... *H01L 21/30625* (2013.01); *H01L 21/304* (2013.01); *H01L 21/6835* (2013.01); *H01L 21/6836* (2013.01); *H01L 2221/68313* (2013.01); *H01L 2221/68327* (2013.01); *H01L 2221/68354* (2013.01)

(58) Field of Classification Search
CPC ........... H01L 21/30625; H01L 21/6836; H01L 21/6835; H01L 21/304; H01L 2221/68313; H01L 2221/68327; H01L 2221/68354
See application file for complete search history.

(56) References Cited

U.S. PATENT DOCUMENTS

| 6,013,534 A | * | 1/2000 | Mountain | ........... H01L 21/6835 257/E21.599 |
|---|---|---|---|---|
| 6,017,822 A | | 1/2000 | Mountain | |
| 2010/0092718 A1 | | 4/2010 | Shin et al. | |
| 2012/0295400 A1 | | 11/2012 | Hatakeyama et al. | |

FOREIGN PATENT DOCUMENTS

EP   2 339 617 A1   6/2011

* cited by examiner

*Primary Examiner* — Kyoung Lee
(74) *Attorney, Agent, or Firm* — Oliff PLC

(57) ABSTRACT

A method for thinning samples including the steps of: a) providing at least one sample having a front and a rear face, b) providing a frame substrate having a first face and a second face opposite the first, including a through-opening which opens into the first and second face, which is configured to receive the sample, c) positioning the sample so it is disposed in the through-opening, the front face being oriented to the same side as the first face, and d) thinning the frame substrate and the sample simultaneously from the first face and the front face, respectively, so that at the end of thinning, the faces extend substantially in the same plane, the thinning being carried out using a grinder, the frame substrate and the sample being disposed on a rotary disk held in place by aspiration, the flanks of the sample remaining free during the thinning.

15 Claims, 3 Drawing Sheets

Figure 8:
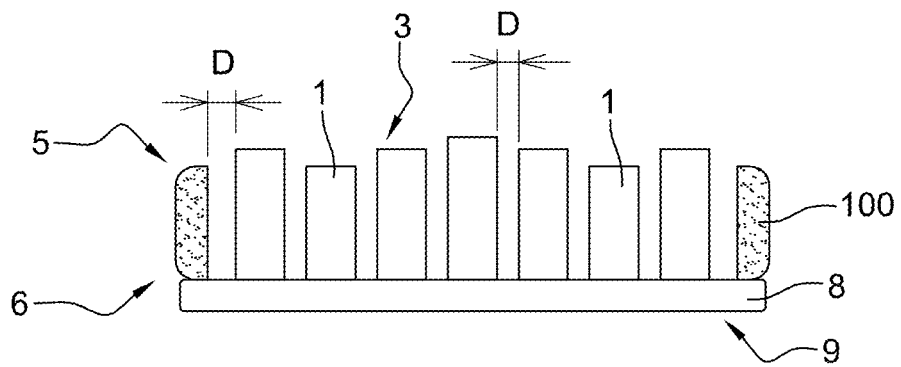

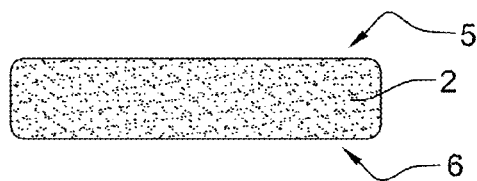
Fig. 1
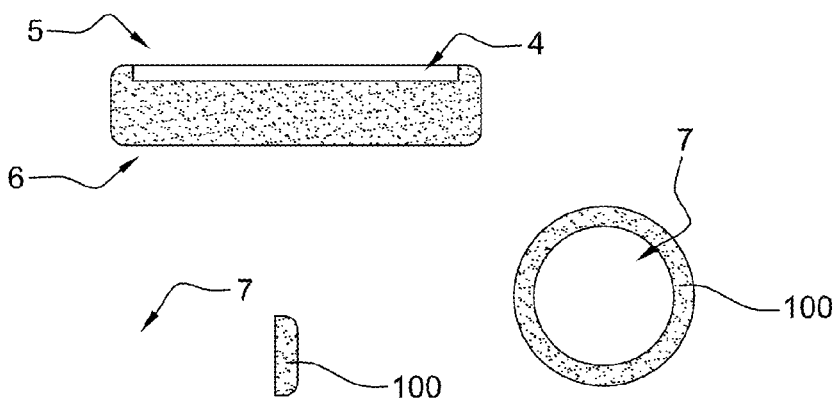
Fig. 2
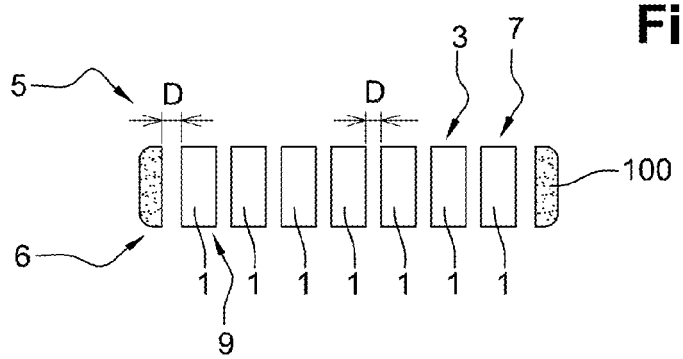
Fig. 3   Fig. 4
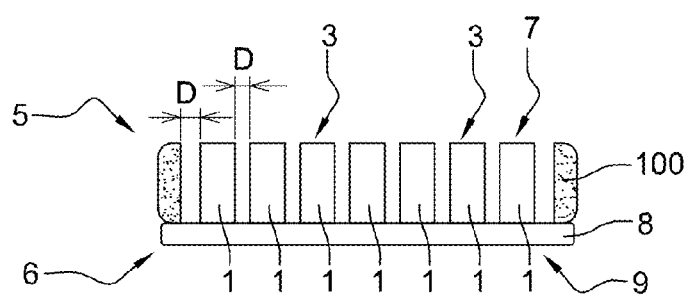
Fig. 5
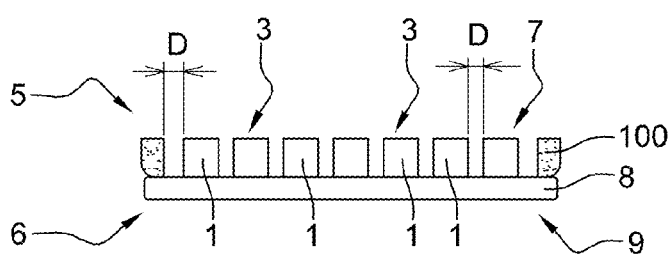
Fig. 6
Fig. 7

METHOD FOR THINNING SAMPLES

The present invention provides a method of thinning samples for applications in a field using microelectronics techniques, the sample may be a substrate made for example of a semiconductor material, or an electronic component, such as a chip.

In the field of thinning of chips, the DBG (acronym of Dicing Before Grinding) method is widely used. It consists in using chips which are already formed on a silicon plate, which are pre-cut beforehand from the front face of the plate, and then thinned from the rear face, the front face being bonded beforehand on an adhesive film made of a plastic material, commonly called 'tape' or 'sticky'.

This method requires the establishment of a complete line for thinning plates having a minimum diameter of 200 mm. This line comprises sequences of steps, such as for example: the spreading of the adhesive film on the rear face of the plate, a step of cutting the chips, a grinding step with three refining stages: coarse grinding, average grinding and very fine grinding or dry polishing, a stress removal step for example by plasma . . . and the tools and associated machines such as a machine for depositing the tape and for removing the tape, a Bernoulli-type system for gripping the plates (in the case of chips smaller than 100 µm), a 'pick and place' equipment for gripping and mounting the chips and for the packaging thereof, etc.

One of the drawbacks met with such a line is that it is dedicated to one single plate diameter (for example 200 mm or 300 mm). Moreover, when a frame is used, it is generally made of a metal which generates risks of contamination of the plates and of the chips so that it is impossible to perform complementary steps directly on the line or on apparatuses subsequently to the method, such as mechanical and chemical polishing operations (CMP), cleaning, etching, bonding, depositions, implantation of ionic species . . . . In the conventional methods, the surface of the metallic frame is thus voluntarily maintained too lower than the surface of the areas to be thinned (typically several hundreds of micrometers, for example about 700 µm). In case of contaminations, it is then necessary to remove the contaminated plates or the contaminated chips laminated on an adhesive film for a decontamination before being capable of restoring an environment and surfaces compatible with subsequent treatments in conventional microelectronics equipments.

Another thinning method consists in collectively thinning chips. The latter are bonded on an adhesive film, which is, in turn, stretched and fastened on a metallic frame held at a level below the level of the grinding rotary disk during the thinning operation, in order to avoid any contact with the grinder. Nonetheless, this approach is limited by two main drawbacks: the thinning of the plates is restricted to obtaining a threshold final thickness of about 80 micrometers and the attack of the grinder significantly damages the edge of the chips or the flanks of the substrates, so that the defectiveness is too significant. This last point is much more pronounced as the thickness of the chip is thin.

One of the objects of the present invention is to overcome at least one of these drawbacks. To this end, the present invention provides a method of thinning samples for applications in particular in the field of microelectronics, optoelectronics and power components, the method comprising the steps of:

a) Providing at least one sample having a front face, a rear face opposite to the front face and flanks which extend between the front face and the rear face, b) Providing a frame substrate having a first face and a second face opposite to the first face, the frame substrate comprising a through-opening which opens into the first face and into the second face, the through-opening being configured to receive the at least one sample, c) Positioning the at least one sample with respect to the frame substrate so that the at least one sample is disposed in the through-opening, the front face being oriented to the same side as the first face, and d) Thinning the frame substrate and the at least one sample simultaneously from the first face and from the front face, respectively, so that at the end of thinning, the first face of the frame substrate and the front face of the at least one sample extend substantially in the same plane, thinning being carried out by grinding using a grinder, the frame substrate and the at least one sample being disposed on a rotary disk and held in place by aspiration, the flanks of the at least one sample remaining free during the thinning operation.

Thus, this method enables thinning the sample and the frame substrate (or frame) at the same time so that the attack of the thinning tools is undergone by the frame substrate. Thus, the defectiveness of the edges of the sample is reduced compared to a method of the prior art. Moreover, this method allows a wide versatility regarding the characteristics of the samples to be thinned. Indeed, it is possible to easily adapt the size of the frame substrate and the size of the through-opening to the size of the sample or to the requirements of subsequent treatments. Thinning of a sample having, for example, a 200 mm diameter may be followed directly by a treatment in standard equipments dedicated to plates with a 300 mm diameter, thanks to the use of a frame substrate, the outer diameter of which is 300 mm. Furthermore, thinning being also carried out on the frame substrate, the initial thickness of the frame substrate no longer constitutes a limit to the thinning.

This method allows performing an even thinning. Furthermore, grinding is initiated mainly on the frame substrate so that the peeling of the sample is limited. Thinning by mechanical polishing is possibly assisted by a chemical polishing.

Moreover, the flanks of the samples remaining free, the samples may be then easily recovered once thinned, in particular by conventional <<pick and place>> tools.

According to one disposition of the invention, the positioning of the at least one sample with respect to an adjacent sample or with respect to the frame substrate or with respect to a transverse wall partitioning said frame substrate is carried out according to an interlayer distance D comprised between 10 micrometers and 3 000 micrometers.

For example, the interlayer distance D is comprised between 10 micrometers and 50 micrometers.

According to one disposition, prior to the thinning step d), the at least one sample and the frame substrate are configured so that the front face of the at least one sample protrudes from the first face of the frame substrate by a distance smaller than 100 micrometers, advantageously smaller than 50 micrometers and for example a distance smaller than about 30 micrometers, and step d) comprises, prior to the simultaneous thinning of the frame substrate and of the at least one sample, a step d1) of thinning the at least one sample alone.

Advantageously, before the thinning step d), the at least one sample and the frame substrate are configured so that the front face of the at least one sample is set back with respect to the first face of the frame substrate and step d) comprises, prior to the simultaneous thinning of the frame substrate and of the at least one sample, a step d1) of thinning the frame substrate alone.

In another disposition before the thinning step d), the at least one sample and the frame substrate are configured so that the front face of the at least one sample extends substantially in the plane of the first face of the frame substrate.

These dispositions enable limiting the damage of the edges of the samples protected from the vibrations subjected by the thinning tool which may generate peelings. In the case of grinding, the attack of the grinder is initiated on the frame substrate from the beginning when the frame substrate has a thickness similar to or greater than the thickness of the sample. Nonetheless, at the end of thinning, regardless of the respective initial thicknesses of the frame substrate and of the sample, the grinder initiates the grinding on the frame substrate so that the defectiveness remains limited in comparison with the approach where the grinding is entirely performed directly on the sample without any protection. It is noteworthy that the difference of levels of the front face and the first face is for example determined by the accuracy of the specification of thickness of the sample, for a silicon sample, this accuracy is about of 30 micrometers.

When the frame substrate protrudes, the latter is thinned at first. When the sample forms protrusion, the latter is thinned at first.

In this last case, step d1) comprises a thinning operation by grinding performed in several steps, using for example grinders with finer grains in order to start thinning, then grinders with larger grains for the simultaneous thinning of the sample and the frame substrate, (that is to say when the front face is in the same plane as the first face) and then possibly grinders with finer grains in order to end the thinning. The starting of thinning may be envisaged for example with grinders with fine grains (for example a 2000 or 8000 mesh) then continuing with grinders with larger grains (for example 320 meshes). This approach is well adapted in particular in the case of a slight overrun of the surface of the sample to be thinned with respect to the first face of the frame substrate.

An alternative to the achievement of step d1) by grinding is a chemical thinning, for example a dry chemical thinning, until the front face of the at least one sample extends substantially in the plane of the first face.

According to a second alternative, the thinning of the at least one sample is considerable enough to remove the entire thickness of the material of the at least one sample damaged or having peeling because of thinning on a protruding portion.

Depending on the desired surface roughness, a mechanical and chemical polishing (CMP) may be applied at the front face of the samples after grinding.

According to one disposition, the material of the frame substrate is devoid of any material likely to contaminate the at least one sample. Hence, the step consisting in thinning the frame substrate simultaneously with the sample does not contaminate the latter by undesirable elements. For example, a silicon frame will be selected for thinning chips carried by a silicon substrate.

Advantageously, the material of the at least one sample and the material of the frame substrate are selected among silicon, glass, sapphire, aluminum oxide, silicon carbide, germanium, niobium and lithium oxide (also called lithium niobate) LNO or LiNbO3, lithium and titanium oxide (also called lithium tantalate) LTO, the elements and the alloys of elements of column IV, the elements and the alloys of elements of columns III and V, the elements and the alloys of elements of columns II and VI, and for example the material of the at least one sample and the material of the frame substrate are identical.

Thinning of the frame substrate and of the at least one sample is then performed at a similar speed enabling reaching a very good flatness. Moreover, the dust of the particles generated by thinning of the frame substrate is not contaminant so that subsequent treatments may be subsequently applied, and even in the presence of the frame.

According to one possibility, the material of the frame substrate is selected so as to present the same thinning speed as the material of the at least one sample.

Advantageously, the size of the through-opening measured in the plane of the front face is slightly larger than the size of the sample measured in the same plane so as to avoid any friction during the disposition of the sample.

According to one possibility, step c) comprises the disposition of the frame substrate and the sample on a planar support so that the second face of the frame substrate extends substantially in the same plane as the rear face of the sample. Thus, the method is easy to implement, it is not necessary to hold the first face of the frame substrate at a position far below the position of the front face of the sample as would have been the case with a conventional metallic frame substrate.

According to one variant, the frame substrate has a thickness greater than the thickness of the at least one sample so that, after the thinning step d), the frame substrate presents a thickness greater than 150 micrometers. This thickness enables it to preserve sufficient mechanical properties so as to be handled, with the thinned sample at the same time in the frame substrate. It is then easy to carry out new steps on the sample thinned and held in the frame substrate which remains rigid. The possible thinning of the sample is even more significant and thinning may be performed until obtaining a sample, the thickness of which is well below 40 micrometers. For example, the thickness of the sample may be thinned to 30 micrometers.

According to one possibility, the second face of the frame substrate protrudes from the rear face of the sample. Despite a greater thickness of the frame substrate, this configuration allows the latter to preserve a first face substantially in the same plane as the front face of the sample. In this case, the second face of the frame substrate is held protruding from the rear face of the sample so that the front face and the first face are thinned simultaneously.

According to one disposition, the at least one sample provided at step a) comprises a substrate or a component, for example for an electronic application, such as a chip. The expression 'component' means as much in the present document a complex component such as a CMOS, a memory, an optical component, an optronic component, a sensor, a MEMS, a component made by any of the techniques developed in micro- and nanotechnologies, biotechnologies etc. . . . as well as a simple component such as an electrical interconnection. The sample may be constituted by one single material or by several materials, virgin material or having already undergone various technological steps prior to the thinning thereof.

The subsequent steps made directly accessible by the method of the invention, according to processing step e) include in particular steps of dry-etching or wet-etching, deposition, planarization, polishing, cleaning, encapsulation of chips in electronic packages, direct bonding of chips for an affixing, etc.

Advantageously, the method comprises between step c) and step d) a step c1) of setting up, for example by laminating, a first adhesive film on the frame substrate and on the at least one sample by adhesion of the first adhesive film respectively on the second face and on the rear face. This facilitates the handling of the sample in particular if the latter presents a very thin thickness after thinning. Moreover, the presence of this first adhesive film enables absorbing the possible small differences of level between the front face and the first face.

In the case where the frame substrate presents a thickness significantly greater than the thickness of the sample, a step of stacking the first adhesive film and the frame substrate allows raising the sample and placing the front face and the first face of the frame substrate on a substantially similar plane for a simultaneous thinning.

According to one possibility, step c1) is followed by a step c2) comprising the cutting of the adhesive film along the peripheral perimeter of the frame substrate.

According to one possibility, step c) comprises the disposition of the frame substrate on the rotary disk followed by the disposition of the at least one sample in the through-opening of the frame substrate. This variant is particularly advantageous when the final thickness of the thinned sample enables avoiding the use of the first adhesive film, this thickness is for example about 150 mm for a silicon sample. It allows then protecting the flanks of the sample when thinning is initiated by the grinder and also obtaining a low variation of the total thickness (also known by the acronym TTV for Total Thickness Variation).

According to one variant, step c) comprises the positioning of the at least one sample on a planar support and then the disposition of the frame substrate on said planar support so that the through-opening surrounds the at least one sample.

According to one variant, step a) comprises the provision of a plurality of samples, and step b) comprises the provision of a frame substrate comprising one single through-opening in which the plurality of samples is disposed to step c), or step b) comprises the provision of a frame substrate comprising a set of through-openings and step c) comprises the disposition of each sample in a respective through-opening.

This configuration enables a simultaneous thinning of several samples each may have different sizes. The frame substrate is also adaptable by providing a set of through-openings bordered by non-open areas, in particular useful in the case where the samples are fragile and with very small sizes. Indeed, the edges of the samples are better protected from the thinning initiation by the grinder because of the proximity of the non-open areas and the first adhesive film is also very well protected by the presence of these non-open areas so that other subsequent treatments may be directly applied. For example, in the case of a CMP polishing, the upper plane of the samples is barely rounded because the edges of the samples are very close to each other. Moreover, during wet- or dry-etching, very few areas of the first adhesive film are exposed to etching so that the deterioration of said first film is very low.

According to one possibility, step a) comprises the provision of a plurality of samples and step c) comprises an individualized management of the disposition of each sample. Each of the samples is then individually collected and disposed for example by means of tweezers or by means of an automated tool. A <<pick and place>> system allows, for example, a high-speed execution of these steps.

According to a variant, step a) comprises the provision of a plurality of samples and step c) comprises the collective disposition of the plurality of samples. According to another variant, step a) comprises the steps of:

i) Providing a plate comprising a plurality of samples, ii) Setting up by laminating a second adhesive film on the plate, iii) Cutting the plate so as to individualize the samples secured to the second adhesive film, and step c) comprises the steps of:

iv) Affixing the second adhesive film on the frame substrate so as to collectively dispose the plurality of samples, and v) Removing the second adhesive film.

Thus, the disposition of the plurality of the samples is collective, rapid and performed in an accurate way.

Advantageously, the through-opening in the frame substrate provided at step b) is carried out by a step b1) of piercing the frame substrate from the first face or from the second face so as to obtain a through-opening which opens into the first face and into the second face. The frame substrate is prepared (for example planarized) beforehand when it is necessary so as to present a surface roughness compatible with treatments subsequent to thinning to which the frame substrate may be subjected at the same time as the samples.

According to one possibility, the piercing step b1) comprises a mechanical grinding step (in other words 'thinning') followed by a chemical etching step.

According to another variant, the piercing step b1) comprises a mechanical grinding step from the first face of the frame substrate so as to create a recess, and a localized thinning step, carried out on the second face until reaching the recess so as to obtain the through-opening.

According to still another variant, the piercing step b1) comprises a dry-etching or a wet-etching.

According to one disposition, the piercing step b1) comprises several piercings carried out by laser, by mechanical cutting, by ultrasounds or by dry-etching or wet-etching, so as to obtain a set of through-openings.

Other aspects, objects and advantages of the present invention will better appear on reading the following description of different embodiments thereof, given by way of non-limiting examples and made with reference to the appended drawings. For a better readability, the figures are not necessarily to the scale of all the represented elements. For sake of simplicity, in the following description, identical, similar or equivalent elements of the different embodiments carry the same numerical references.

FIGS. 1 to 7 schematically show a first embodiment of the method according to the invention.

Figure 9:
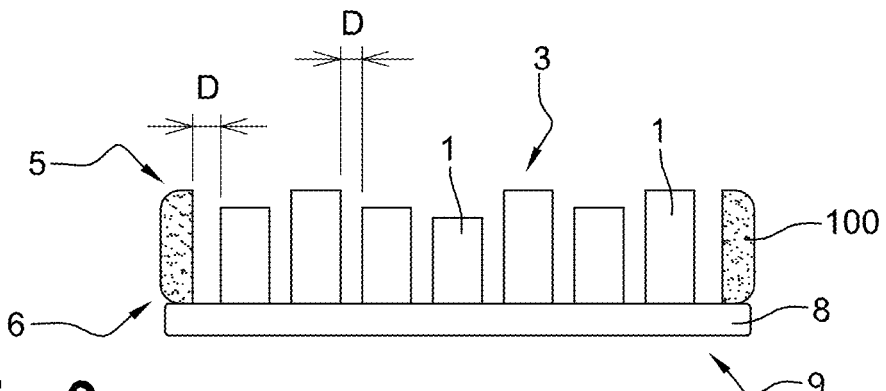
Figure 10:
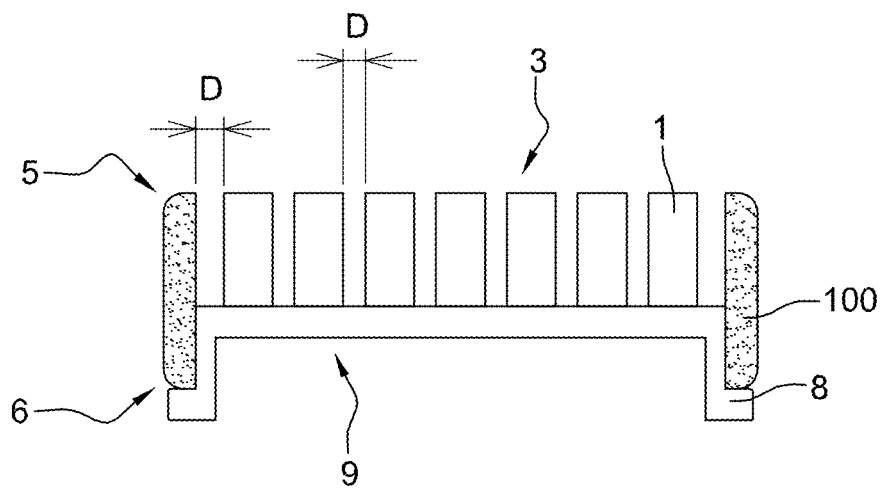
Figure 11:
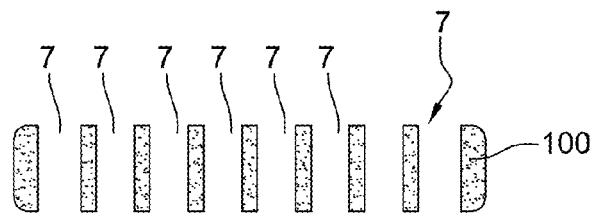
Figure 12:
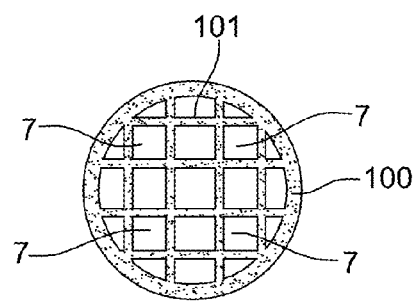
Figure 13:
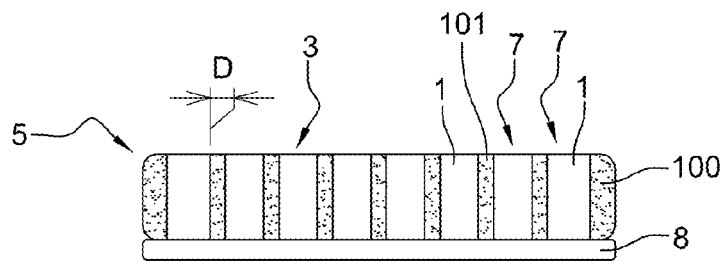

FIGS. 8 to 10 each illustrate a variant of the first embodiment according to the invention.

FIGS. 11 to 14 schematically show a second embodiment of the method according to the invention.

Figure 15:
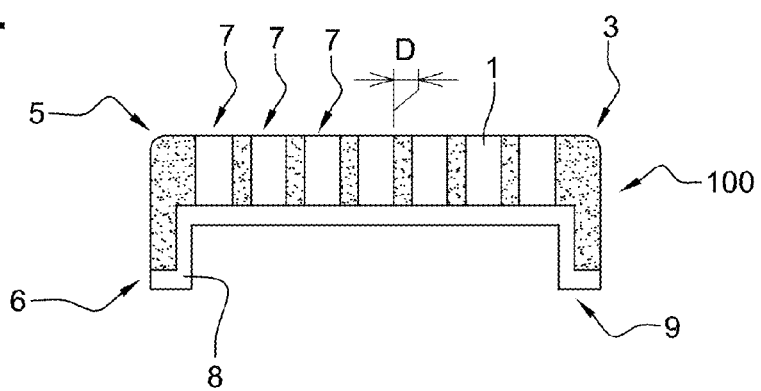

FIG. 15 schematically illustrates a variant of the second embodiment of the method according to the invention.

FIGS. 1 to 4 illustrate a method for preparing a frame substrate 100 for thinning a sample 1. A frame substrate 100 is firstly provided in the form of a slice 2 with about 725 micrometer thickness obtained for example from the cutting of a silicon ingot (FIG. 1). A mechanical grinding step is carried out from the first face 5 so as to create a central recess 4 in the slice 2, presenting a depth of about 50 micrometers (FIG. 2). The diameter of the slice 2 is about 200 mm and the recess 4 presents a 180 mm diameter so as to preform a ring with about 10 mm depth, defined between the outer radius and the inner radius of the ring. Then, the slice 2 is turned over so as to present the second face 6 opposite to the first face 5. A thinning operation is therefore carried out from the second face 6 so as to open the recess 4 formed beforehand (FIG. 3). A silicon frame substrate 100 presenting a through-opening 7 which opens into the first face 5 and into the second face 6 is therefore obtained. According to a non-illustrated variant, after cutting in the ingot and prior to the realization of a recess 4, the slice 2 is subjected to complementary thinning, etching and/or surface preparation treatments, well known in microelectronics or microtechnology. These treatments aim to reduce the roughness of the rough cut surfaces or to remove the damages and stresses caused by the cutting of the ingot.

FIG. 4 illustrates a top view of the frame substrate 100 presenting a ring-like general shape. Other techniques for forming the non-illustrated through-opening 7 may be considered. According to one possibility, a method of thinning with grinder (grinding) is applied: the first grinding step is followed by a chemical etching to open the recess 4 in the second face 6. According to still other possibilities, the through-opening 7 is made, for example, by wet-etching or dry-etching, by mechanical or laser cutting, by ultrasonic machining or by any combination of these techniques.

According to one disposition, the frame substrate 100 is made of a material other than silicon such as glass, sapphire, aluminum oxide, silicon carbide, germanium, niobium and lithium oxide $LiNbO_3$ (LNO), lithium and titanium oxide LTO, the elements and the alloys of elements of column IV, the elements and the alloys of elements of columns III and V, such as InP, AsGa, and the elements and the alloys of elements of columns II and VI, such as CZT, cadmium and zinc telluride alloy, or other non-contaminant materials, having mechanical properties close to the mechanical properties of the samples to be thinned, thereby allowing a similar thinning speed, and compatible with the techniques used in microelectronics and with the nature of the samples 1 to be thinned. The metallic frame substrates 100 are generally proscribed.

According to another variant, the frame substrate 100 is formed from a wafer made of an aforementioned material in particular when the material is not available in the form of a slice 2 obtained from an ingot.

FIGS. 5 to 7 illustrate the thinning of a plurality of samples 1 disposed in the through-opening 7 of the frame substrate 100. The plurality of samples 1 is composed by a plurality of electronic components. According to another possibility, the samples 1 may be formed by substrates to be thinned, in particular constituted by the aforementioned materials regarding the frame substrate. These samples 1 are individually collected and disposed in the through-opening 7 by an automated tool enabling the individual management of each of the samples 1. Then, a first adhesive film 8 is set up by laminating on the second face 6 of the frame substrate 100 and on a rear face 9 of the samples 1 so that said faces 6, 9 extend in the same plane (step c1—FIG. 6). The first adhesive film 8 comprises a film made of an extensible plastic material, covered by a UV-exposure sensitive adhesive so as to facilitate the removal of the film. Then, it is cut by a Powatec-type manual laminator or by an automated laminator around the periphery of the frame substrate 100.

As illustrated in FIGS. 5 and 6, the thicknesses of the samples 1 and of the frame substrate 100 are similar. Thus, the exposed faces, namely the front face 3 of the samples 1 and the first face 5 of the frame substrate 100 extend substantially in the same plane. This set formed by the plurality of samples 1 and by the frame substrate 100 is therefore disposed, thanks to the first adhesive film 8 which joins the set together, on a rotary disk allowing holding the set in place by aspiration (not illustrated). Then, a grinding begins by means of a diamond grinder so as to simultaneously thin the frame substrate 100 and the samples 1. The initiation of the grinding taking place on the frame substrate 100, the flanks of the samples 1 are protected. The variation of the total thickness of the samples 1 is also improved therefrom. Similarly, the dispersion of the thicknesses values of the various samples is also improved.

According to another arrangement shown in FIGS. 8 and 9, the front face 3 of the samples 1 is not perfectly aligned with the first face 5 of the frame substrate 100. In FIG. 8, the plurality of samples 1 has a thickness greater than the thickness of the frame substrate 100 or at least the front face 3 thereof exceeds the first face 5 of the frame substrate 100 at the most by 100 µm, or better by 50 µm, or still better by 30 µm so as to limit the incidence of defectivenesses on the flanks of the samples 1. Advantageously, the first face 5 of the frame substrate 100 exceeds the front face 3 of the samples 1 or extends substantially in the same plane in order to reduce as far as possible the formation of defects on the flanks of the samples 1 during the grinding operation (FIG. 9).

The frame substrate 100 constituted by a non-pollutant material may be thinned by grinding until the desired thickness of the samples 1 is reached. Thus, the conventional limitation of a thinning to 80 micrometers according to the DBG technique may be here reduced to 40 micrometers, without actually contaminating the electronic components 1.

As illustrated in FIG. 10, it is possible to further reduce the final thickness of the samples 1 thanks to a frame substrate 100 having a thickness significantly greater than the thickness of the samples 1 to be thinned, so as to preserve its rigidity and its capability to be handled after the thinning step. For example, when the frame substrate 100 provided at step a) has a 1200 micrometer thickness, the thinning step d) performed over a 650 micrometer thickness results in obtaining a frame substrate 100 having a 550 micrometer thickness, thereby guaranteeing thereto a sufficient mechanical strength to ensure the displacement or the handling of the chips 1 in processing step e) of at least one subsequent treatment.

Besides, as illustrated in FIG. 10, the first face 5 of the frame substrate 100 is substantially aligned on the front face 3 of the samples 1 so that the thinning step d) is immediately carried out simultaneously on the samples 1 and on the frame substrate 100. This is obtained by lowering the level of the second face 6 of the frame substrate 100 which thus protrudes from the rear face 4 of the samples, for example by stacking via the aspiration cylinder 9 (or 'chuck'), in the presence of the first adhesive film 8.

According to a non-illustrated variant, the stacking is carried out in the absence of the first adhesive film 8.

According to a non-illustrated variant, the plurality of samples 1 is collectively disposed in the frame substrate 100 using a second adhesive film 11. This variant comprises the provision of a plate comprising a plurality of samples 1 such as electronic chips (step i). The second adhesive film 11 is disposed on the exposed face of the plurality of chips, namely the front face 3 intended to be thinned (step ii). The plate is then cut so as to individualize each of the chips 1 which remain adherent to the second adhesive film 11 (step iii). Then, according to step c) of the method, the second adhesive film 11 is affixed on the frame substrate 100 so as to collectively dispose the plurality of chips 1 in the through-opening 7. Then, the second adhesive film 11 is removed (step iv) and v)) thereby releasing the front faces 3 of each of the chips 1.

According to another non-illustrated possibility, each of the samples 1 of the plurality of samples 1 is disposed by means of a <<pick and place>> system in the through opening 7.

It may be noted that in the embodiment of the method according to the invention shown in FIGS. 1 to 7, in the variant shown in FIGS. 8 to 10, as well as in the previously described variants, the samples 1 are disposed on the frame substrate 100 with an interlayer distance D (i) between the flanks of the adjacent samples 1 and (ii) between the side flanks of the sample 1 with the frame substrate 100 which is larger than 10 micrometers and typically comprised between 10 and 50 micrometers. In other terms, the samples 1 have therebetween and with the frame substrate 100 a lateral freedom which allows the gripping thereof by a <<pick and place>> system. Nevertheless, the free interlayer distance D should for example remain smaller than 3 mm to avoid an edge effect during the thinning step which might round the front face 3 of the samples 1.

Figure 14:
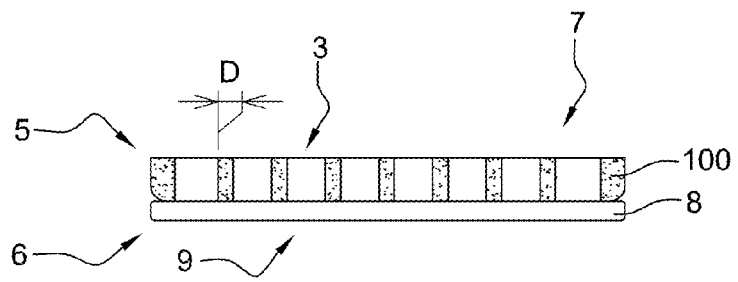

FIGS. 11 to 14 illustrate a second embodiment which differs from the previous one in that a plurality of samples 1 is disposed in a frame substrate 100 having a set of through-openings 7. This set of through-openings 7 is obtained by laser cutting to the size of the samples 1, and results in the formation of a frame substrate 100 having a stencil-like general shape, illustrated in a sectional view in FIG. 11 and in a top view in FIG. 12. A mechanical or ultrasonic cutting, a dry-etching, a wet-etching, etc., through the frame substrate 100 is also possible to generate this set of through-openings 7 delimited by a network of transverse walls 101 which are perpendicular in the illustrated embodiment. In this embodiment, each sample 1 is disposed in a respective through-opening 7 with the dimensions slightly larger than the dimensions of the sample 1 so as to avoid any friction when during the disposition of the sample 1 (FIG. 13—the difference in dimensions is not visible therein). Thus, the edge of the samples 1 is still more protected from the attack of the grinder and the first adhesive film 8 rolled on the rear face 9 of the samples 1 and the second face 6 of the frame substrate 100 is further masked which allows a wide variety of subsequent treatments, in particular applied on the front face 3 of the samples 1 (FIG. 14).

FIG. 15 illustrates a variant applied to the frame substrate 100 including a plurality of through-openings 7, already discussed in relation with FIG. 10. Indeed, the frame substrate 100 has a thickness which is significantly greater than the thickness of the samples 1 to be thinned and the second face 6 of the frame substrate 100 protrudes from the rear face 4 of the samples 1. Advantageously, this allows carrying out a simultaneous thinning according to step d) and preserving a significant mechanical strength of the frame substrate 100 even at the end of thinning.

According to a non-illustrated possibility, the present invention also provides a thinning of one single sample 1 disposed in a dedicated through-opening 7 in a frame substrate 100.

It may be noted that in the embodiment of the method according to the invention shown in FIGS. 11 to 15, as well as in the previously described variants, the samples 1 are disposed on the frame substrate 100 with an interlayer distance D between the flanks of adjacent samples 1 and the transverse wall of the frame substrate which is typically comprised between 10 micrometers and 50 micrometers.

In other terms, the samples 1 have with the walls 101 of the frame substrate 100 a lateral freedom which allows the gripping thereof by a <<pick and place>> system. This interlayer distance D is free but is preferably smaller than 3 000 micrometers in order to avoid an edge effect during the thinning step which might round the front face 3 of the samples 1.

Thus, the present invention provides a method for thinning samples 1 which may be in the form of a substrate or electronic components such as chips, optical components, optronic components, sensors, MEMSs, etc. . . . with a very good flatness, while limiting the defectiveness of the edges, avoiding the contamination, allowing reaching very thin thicknesses. This allows obtaining, for example, surfaces adapted for bonding by molecular adhesion in order to affix chips comprising, or not, a step of implantation of ionic species for photonic applications. Other subsequent treatments may be directly applied on the thinned samples 1, such as the elaboration of thin chips for an encapsulation in electronic packages, thin layers of an alloy of materials III/V for applications in optoelectronics (manufacture of LED) or thin layers of LTO/LNO for manufacturing RF filters.

It goes without saying that the invention is not limited to the embodiments described hereinabove by way of examples but it encompasses all technical equivalents and variants of the described means as well the combinations thereof.

The invention claimed is:

1. A method for thinning samples comprising the steps of:
   a) Providing at least one sample having a front face, a rear face opposite to the front face and flanks which extend between the front face and the rear face,
   b) Providing a frame substrate having a first face and a second face opposite to the first face, the frame substrate comprising a through-opening which opens into the first face and into the second face, the through-opening being configured to receive the at least one sample,
   c) Positioning the at least one sample with respect to the frame substrate so that the at least one sample is disposed in the through-opening, the front face being oriented to the same side as the first face, and
   d) Thinning the frame substrate and the at least one sample simultaneously from the first and from the front face, respectively, so that at the end of thinning, the first face of the frame substrate and the front face of the at least one sample extend substantially in the same plane, the thinning being carried out by grinding using a grinder, the frame substrate and the at least one sample being disposed on a rotary disk and held in place by aspiration, the flanks of the at least one sample remaining free during the thinning operation.

2. The thinning method according to claim 1, wherein the positioning of the at least one sample with respect to an adjacent sample or with respect to the frame substrate or with respect to a transverse wall partitioning said frame substrate is carried out according to an interlayer distance D comprised between 10 micrometers and 3000 micrometers.

3. The thinning method according to claim 2, wherein the interlayer distance D is comprised between 10 micrometers and 50 micrometers.

4. The thinning method according to claim 1, wherein, prior to the thinning step d), the at least one sample and the frame substrate are configured so that the front face of the at least one sample protrudes from the first face of the frame substrate by a distance smaller than 100 micrometers, and step d) comprises, prior to the simultaneous thinning of the frame substrate and of the at least one sample, a step d1) of thinning of the at least one sample alone.

5. The thinning method according to claim 1, wherein, prior to the thinning step d), the at least one sample and the frame substrate are configured so that the front face of the at least one sample is set back with respect to the first face of the frame substrate and in which step d) comprises, prior to the simultaneous thinning of the frame substrate and of the at least one sample, a step d1) of thinning of the frame substrate alone.

6. The thinning method according to claim 1, wherein, prior to the thinning step d), the at least one sample and the frame substrate are configured so that the front face of the at least one sample extends substantially in the plane of the first face of the frame substrate.

7. The thinning method according to claim 1, comprising, after step d), at least one processing step e) of the at least one sample disposed in the through-opening of the frame substrate, such as a dry- or wet-etching step, a depositing step, a planarization step, a polishing step, a cleaning step, a step of encapsulation in electronic packages or a direct bonding step.

8. The thinning method according to claim 1, wherein the material of the at least one sample and the material of the frame substrate are selected among silicon, glass, sapphire, aluminum oxide, silicon carbide, germanium, niobium and lithium oxide LNO, lithium and titanium oxide LTO, the elements and the alloys of elements of columns IV, the elements and the alloys of elements of columns III and V, and the elements and the alloys of elements of columns II and VI.

9. The thinning method according to claim 1, comprising between step c) and step d) a step c1) of setting up, a first adhesive film on the frame substrate and on the at least one sample by adhesion of the first adhesive respectively on the second face and on the rear face.

10. The thinning method according to claim 1, wherein the frame substrate has a thickness greater than the thickness of the at least one sample so that, after the thinning step d), the frame substrate has a thickness greater than 150 micrometers.

11. The thinning method according to claim 1, wherein the second face of the frame substrate protrudes from the rear face of the at least one sample.

12. The thinning method according to claim 1, wherein step a) comprises the provision of a plurality of samples, and
wherein step b) comprises the provision of a frame substrate comprising one single through-opening in which the plurality of samples is disposed at step c), or
wherein step b) comprises the provision of a frame substrate comprising a set of through-openings and step c) comprises the disposition of each sample in a respective through-opening.

13. The thinning method according to claim 1, wherein step a) comprises the provision of a plurality of samples and wherein step c) comprises the individual disposition of each sample.

14. The thinning method according to claim 1, wherein step a) comprises the provision of a plurality of samples and in which step c) comprises the collective disposition of the plurality of samples.

15. The thinning method according to claim 14, wherein step a) comprises the steps of:
i) Providing a plate comprising a plurality of samples,
ii) Setting up by lamination a second adhesive film on the plate,
iii) Cutting the plate so as to individualize the samples secured to the second adhesive film; and
wherein step c) comprises the steps of:
iv) Affixing the second adhesive film on the frame substrate so as to collectively dispose the plurality of samples, and
v) Removing the second adhesive film.

* * * * *